United States Patent
Beyer et al.

(10) Patent No.: US 6,245,653 B1
(45) Date of Patent: Jun. 12, 2001

(54) METHOD OF FILLING AN OPENING IN AN INSULATING LAYER

(75) Inventors: Gerald Beyer, Kortrijk; Karen Maex, Herent; Joris Proost, Mol, all of (BE)

(73) Assignees: Applied Materials, Inc., Santa Clara, CA (US); Interuniversity Microelectronics Center, vzw, Leuven (BE)

( * ) Notice: Subject to any disclaimer, the term of this patent is extended or adjusted under 35 U.S.C. 154(b) by 0 days.

(21) Appl. No.: 09/275,922

(22) Filed: Mar. 24, 1999

Related U.S. Application Data

(60) Provisional application No. 60/083,822, filed on Apr. 30, 1998.

(51) Int. Cl.[7] ................................................. H01L 21/44
(52) U.S. Cl. ..................... 438/597; 438/597; 438/598; 438/618; 438/629; 438/633; 438/648; 257/618; 257/621; 257/622; 257/623; 257/624; 257/776
(58) Field of Search .................................. 438/597, 598, 438/618, 629, 637, 648; 257/774, 618, 621–624

(56) References Cited

U.S. PATENT DOCUMENTS

| | | | |
|---|---|---|---|
| 5,371,042 | 12/1994 | Ong | 437/194 |
| 5,693,564 | * 12/1997 | Yu | 437/192 |
| 5,911,113 | * 6/1999 | Yau et al. | 438/649 |

FOREIGN PATENT DOCUMENTS

| | | | |
|---|---|---|---|
| 552893 | 7/1993 | (EP) | H01L/21/90 |
| 776037 | 5/1997 | (EP) | H01L/21/768 |
| 799903 | 10/1997 | (EP) | C23C/14/14 |
| 97/30479 | 8/1997 | (WO) | H01L/23/532 |

OTHER PUBLICATIONS

EP Search Report for EP99 87 0058 of Mar. 8, 1999.

* cited by examiner

Primary Examiner—Matthew Smith
Assistant Examiner—Granville Lee, Jr.
(74) Attorney, Agent, or Firm—Birgit E. Morris

(57) ABSTRACT

The present invention is about a method for filling an opening in an insulating layer in a fast and highly reliable way and can be used to fill openings such as trenches and via holes simultaneously. This method is based on the principle of reaction enhanced wetting and simultaneous seed layer formation. The idea is, in contrast to trying to avoid the $TiAl_3$ formation, to use this reaction to its advantage for the creation of an ultra-thin continuous Al-containing seed layer. The latter allows a bottom to top fill during the subsequent Al-containing metal deposition. As a consequence, the filling process proceeds much faster and is production worthy.

16 Claims, 3 Drawing Sheets

FIGURES:

Via diameter (μm)

Fig. 5 a)
Fig. 5 b)
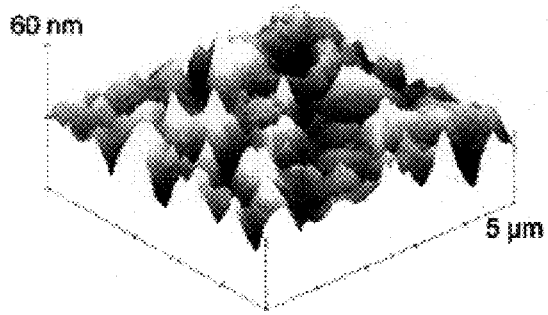
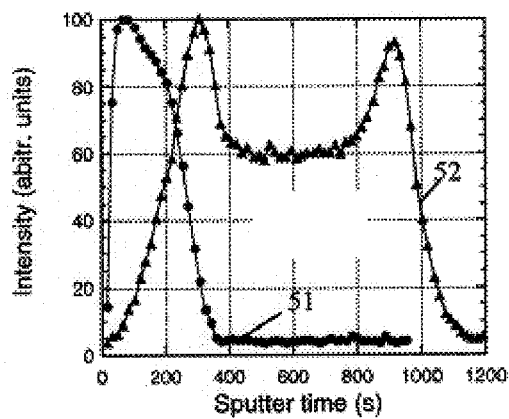
Fig. 6
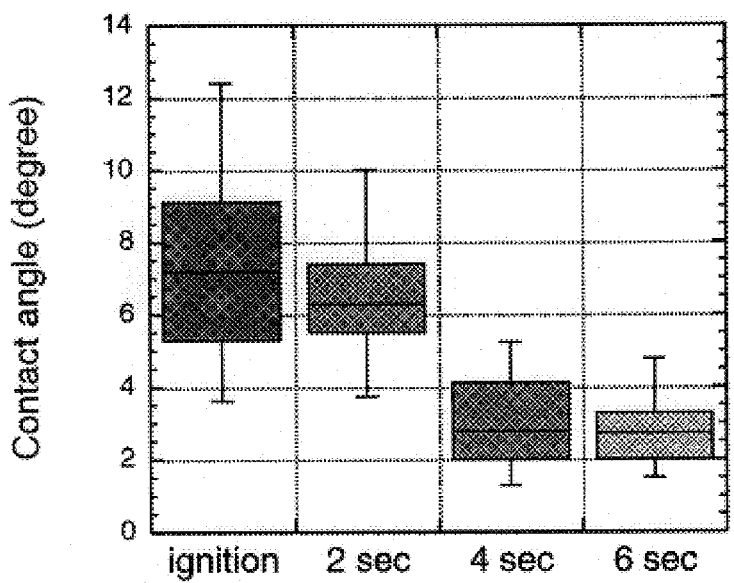

METHOD OF FILLING AN OPENING IN AN INSULATING LAYER

FIELD OF THE INVENTION

This application claims benefit to U.S. provisional application no. 60/083,822 filed Apr. 30, 1998.

The present invention relates to the fabrication process of integrated circuits and particularly to a method of fabricating structures for interconnecting at least parts of these integrated circuits. More particularly, openings, e.g. via openings or trenches, are formed in an insulating layer and filled with Al-containing and/or Cu-containing metals.

BACKGROUND OF THE INVENTION

The ongoing focus on miniaturisation and the increasing complexity of integrated circuits demands for a continuous higher density integration. To achieve this, there is an ongoing downscaling in the dimensions of the active devices as well as of the structures interconnecting these devices. These interconnect structures can comprise multiple metal layers which are, dependent on the desired interconnect pattern, either separated one from another by means of interlayer insulating layers or connected one to the other by means of a connection through the insulating layer. To provide such a connection, first openings are formed in the insulating layer and filled thereafter with a conductive material. Examples of such openings are via holes or contact holes or trenches. To meet the high density integration requirements, the diameter of these openings is decreasing, while at the same time the aspect ratio of these openings is increasing. Furthermore also the number of openings per unit area is increasing due to the high density requirements and therefore also due to the growing number of metal layers. As a consequence the filling process of these openings and in particular the filling yield, reliability and speed are becoming more and more critical.

Classically, the filling process of these openings is a process wherein an Al-containing metal is used to fill these openings. Several methods, i.e. filling processes, have been introduced which use conventional Physical Vapour Deposition, i.e. no directional sputtering by means of e.g. a collimator. Ono et al., Proc. VMIC, 1990, p. 76, describe a method wherein the Al is deposited onto the wafer at a low deposition rate in a single-step process. The wafer is kept at a high temperature of about 500° C. during deposition to ensure contact hole/via fill (Ono et al., Proc. VMIC, 1990, p. 76). Although it is possible to fill the openings with this one step process, one of the inherent disadvantages is that this process is too slow. Another disadvantage is that openings with different aspect ratios cannot be efficiently filled simultaneously on a wafer as required in a modern metallization scheme such as dual damascene.

In another method, as in Park et al., Proc. VMIC, 1991, p. 326, the Al film is first sputter deposited cold. In order to fill the contact openings and/or via openings, the wafer is heated in situ after this deposition in order to reflow the Al into the contact openings and/or via openings. In yet another method, as described in e.g. the United States patent applications U.S. Pat. Nos. 5,371,042 and 5,270,255, a thin and continuous Al-containing seed layer is sputtered cold onto a wetting layer formed in these openings. This sputtering is performed cold in order to avoid dewetting of the Al and the $TiAl_3$ formation. This wetting layer typically consists of either a single Ti layer or a triple barrier layer with a Ti rich surface. After deposition of the seed layer, the remainder of the Al-containing layer is sputtered at an elevated temperature, i.e. usually in the range of 400–500 ° C., and slowly in order to give the material enough time to flow into the opening.

These methods run into problems when the diameter of the opening decreases, particularly when the diameter is in the sub 0.5 µm range and/or for aspect ratios of 2:1 or higher. Because of the increased aspect ratio the deposition of a continuous Al-containing seed layer on the inner walls of the openings by line of sight sputtering is hampered. In fact, during the seed layer formation, the formation of an additional overhang on the top of the small features is initiated. What is typically observed in case of this conventional sputtering into an high aspect ratio opening is that bridging of the top of the via occurs and that a void is created. The void will then be filled by way of Al-containing bulk diffusion, i.e. from top to bottom, which is inherently slower than Al-containing surface diffusion, i.e. from bottom to top, in the temperature range used in the filling process. Consequently yield and reliability of this filling process for openings with high aspect ratios and sub 0.5 µm diameters is questionable, whereas the productivity is far too low.

AIM OF THE INVENTION

It is an aim of the present invention to introduce the principle of reaction enhanced wetting and simultaneous seed layer formation as a basis for a reliable Al-containing metal fill process. The idea is, in contrast to avoiding the TiAl formation, to use this reaction to its advantage for the creation of an ultra-thin continuous Al-containing seed layer. The latter will allow a bottom to top fill during the subsequent Al-containing metal deposition, independent of the dimension and geometry of the opening. As a consequence, the filling process proceeds much faster and is production worthy.

SUMMARY OF THE INVENTION

In an aspect of the invention a method for filling an opening in an insulating layer is disclosed comprising the steps of:

a) forming at least one opening in an insulating film;

b) forming a continuous wetting layer at least on an inner side wall of said opening;

c) depositing a first metal layer at least on said wetting layer at an elevated first temperature to thereby form a metal seed layer; and d) depositing a second metal layer at an elevated second temperature to fill said opening from the bottom to the top.

The composition of the first metal layer, the deposition rate of the first metal layer and the composition of the wetting layer are correlated and are selected to meet the following criteria. At first the wetting layer has to be chosen such that during the deposition of the first metal layer dewetting is avoided, particularly a reaction between the wetting layer and this first metal layer is initiated. This reaction induces the wetting. Examples of such wetting layers are Ti-containing layers or Co-containing layers or Ni-containing layers. Examples of metal layers are Al-containing layers, e.g. Al, AlCu, AlSiCu, AlGeCu, AlSi, AlGe, or Cu-containing layers. At second, the deposition rate of the first metal layer is such that there is sufficient metal available to induce a reaction between the wetting layer and the first metal and simultaneously to form a metal seed layer. Particularly, in an embodiment of the invention, the first metal layer is an Al-containing layer, the wetting layer is a Ti rich layer, the reaction involved is between Al and Ti, i.e. $3Al+Ti \rightarrow Al_3Ti$ and a Al seed layer is formed. Alternatively, the first metal layer can be a Cu-containing layer, the wetting layer can be a Co rich or a Ti rich layer, the reaction involved can be between Cu and Ti or between Cu and Co, and a Cu seed layer can be formed.

According to the method of the present invention, during the deposition of the first and the second metal layer the temperature has to be sufficiently high in order to facilitate the flow of the metal. Particularly, the elevated first and second temperature have to be chosen close to the melting point of the metal under pressurized conditions, i.e. in vacuum. Therefore, these temperatures are typically in the range from 100° C. below the melting point of said metal layer in vacuum to about the melting point of said metal layer in vacuum. Particularly when said metal layer is an Al-containing layer, like e.g. Al or AlCu, these temperatures are typically in the range from 400° C. to 500° C. Even more particularly, the deposition of the first metal layer and the deposition of the second metal layer can be performed subsequently in a chamber of a deposition tool without breaking vacuum, i.e. without switching between low pressure and atmospheric pressure. Furthermore also the value of the elevated first and second temperature can be chosen identical.

In another embodiment of the invention, a method for filling an opening in an insulating layer is disclosed, wherein, after forming at least one opening in an insulating film, a barrier layer is formed at least on an inner wall of said opening.

The method of the present invention can be used for the fabrication of integrated circuits, particularly in sub 0.35 μm CMOS or BiCMOS processes. Particularly these integrated circuits comprise interconnect structures wherein during the process of forming said interconnect structures openings, e.g. via openings or contact openings or trenches, with a sub 0.5 μm diameter and with high aspect ratios, i.e. typically with an aspect ratio of 2:1 or higher, have to be filled. The method of the present invention allows filling these openings in a fast and reliable way. Particularly in an embodiment of the invention an integrated circuit comprising an interconnect structure is disclosed, wherein the process of forming said interconnect structure comprises the method of the present invention for filling an opening in an insulating layer.

BRIEF DESCRIPTION OF THE DRAWINGS

FIG. 5a) is, according to an embodiment of the invention, an AFM picture of the surface of the Al seed layer after the deposition of 50 nm Al FIG. 5b) is, according to an embodiment of the invention, an AES depth profile of the Al seed layer and the Ti/TiN/TiN$_x$ wetting layer.

FIG. 6 depicts, according to an embodiment of the invention, the contact angle of the Al grains of the seed layer versus deposition time using a power 12 kW DC.

DETAILED DESCRIPTION OF THE INVENTION

Figure 1:
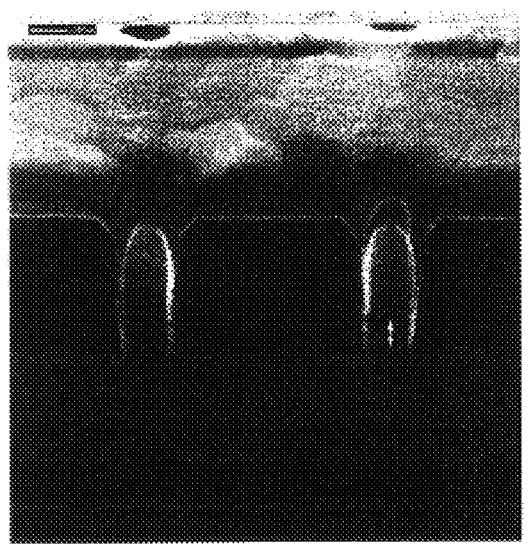
FIG. 1a) depicts, according to an embodiment of the invention, a cross-section of a via opening (aspect ratio 4:1, diameter 0.25 μm) after the deposition of the a first Al-containing metal layer at 475° C. to thereby form an Al-containing seed layer. The seed layer was sputtered at 12 kW for 6 seconds, which corresponds to a thickness of about 150 nm.
FIG. 1b) depicts, according to an embodiment of the invention, the deposition of a second Al-containing layer subsequent to the formation of the seed layer as depicted in FIG. 1a). In this second step the sputter power was lowered to 1 kW for 25 s which corresponds to a thickness of about 70 nm on the seed layer. No bridging has occurred, and the filling of the via opening proceeded from the bottom to the top by surface diffusion.
Figure 1:
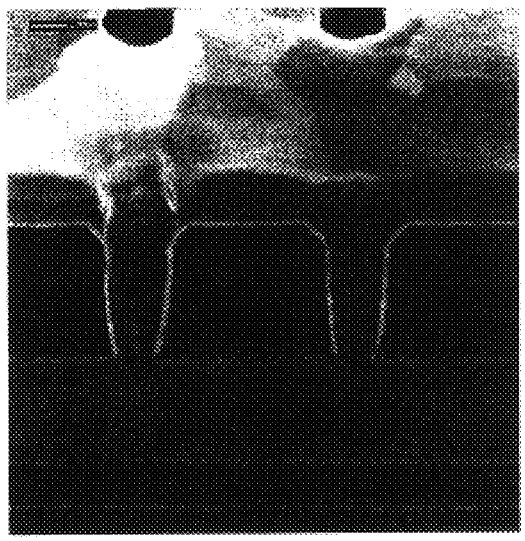

In relation to the appended drawings the present invention is described in detail in the sequel. It is apparent however that a person skilled in the art can imagine several other equivalent embodiments or other ways of executing the present invention, the spirit and scope of the present invention being limited only by the terms of the appended claims.

The filling process of openings in an insulating layer is a process wherein an Al-containing metal is used to fill these openings. According to this process, a thin and continuous Al-containing seed layer is sputtered cold onto a wetting layer formed in these openings. This wetting layer typically consists of either a single Ti layer or a triple barrier layer with a Ti rich surface. This sputtering is performed cold in order to avoid dewetting and the Ti formation. Dewetting can occur if the temperature is chosen too high and/or the wetting characteristics of the wetting layer are insufficient. According to an embodiment of the present invention, where a Ti or Ti rich wetting layer is provided and where a temperature in the range from 400° C. to 500° C. is chosen, dewetting is not an issue. There are various arguments often referred to in order to explain why the TiAl$_3$ formation has to be avoided or suppressed and why a cold Al-containing seed layer is used to accomplish this. Some of these arguments are:

At first, the TiAl$_3$ reaction is detrimental for the line resistance. This problem is not solved by using a cold Al-containing seed layer because high temperatures are applied during the subsequent processing steps and hence, the TiAl$_3$ reaction will proceed anyhow.

At second, the TiAl$_3$ reaction induces an additional overhang on the top of the opening, since the overhang of Ti layer at that place is magnified by a factor of about 4. However, this can be easily overcome by engineering the deposition of the wetting layer to minimise overhang, particularly, by reducing the thickness of the Ti layer and by engineering the shape of the via hole or trench at the top.

At third, Al diffusion on TiAl$_3$ is more cumbersome than on an Al-containing metal. The method of the present invention will circumvent this issue in an advantageous way by properly controlling the TiAl$_3$ reaction instead of avoiding it. When properly controlled, this reaction induces wetting and simultaneously the formation of an Al-containing metal seed layer.

For the purpose of explaining this reaction induced wetting and to introduce some necessary definitions and wordings, first some general principles of reaction enhanced wetting of a liquid on a solid are presented.

The equilibrium balance of interfacial energies of a liquid on a solid is expressed by $\gamma_{sv}=\gamma_{sl}+\gamma_{lv} \cos\theta$, where $\theta$ is the contact angle and $\gamma_{sv}$, $\gamma_{sl}$, and $\gamma_{lv}$ are respectively the solid-vapour, solid-liquid and liquid-vapour interfacial energies. The driving force for wetting or extension of the liquid/solid interface is related to the amount of reduction in energy by the creation of new liquid-solid interfacial area, i.e. spreading. Spreading will occur as long as there is a driving force i.e. as long as $\gamma_{sv}-\gamma_{sl}>\gamma_{lv} \cos\theta$. Therefore, under non reactive conditions, the driving force for wetting can be defined as $(\gamma_{sv}-\gamma_{sl})$.

When there is a chemical reaction at the interface, the free energy (dG) of the reaction enhances the driving force for wetting as indicated:

$$\gamma_{sv} - \left(\gamma_{sl} + \frac{-dG}{dA\,dt}\right)$$

In this case, it can be stated that the chemical reaction at the interface determines the degree of wetting. Moreover, $\gamma_{sl}$ and $\theta$ are time dependent. The non-equilibrium driving force for spreading is expressed by $\gamma_{lv} (\cos\theta-\cos\theta_t)$, where $\theta_t$ is the time dependent contact angle. It is observed that drops spreading under the influence of interfacial chemical reactions obey the following empirical expression:

$$\theta_t - \theta_f \propto e^{-t/\tau}$$

where $\theta_t$ is the contact angle at time t, $\theta_f$ is the final stable contact angle and $\tau$ is a time constant characteristic of the liquid-solid reactivity. The final contact angle is inversely proportional to the changes in interfacial energies as well as the free energy associated with the reaction.

Particularly, the reaction induced spreading has been investigated for a liquid, being an Al-containing coating on solid, being a centimeter-scale ceramic substrate. There is currently no rigorous treatment of wetting kinetics in the presence of an interfacial reaction. From the coating studies, there are, however, some experimental data relevant to our work.

The reaction involved according to the method of the present invention is: 3Al+Ti→Al$_3$Ti. The time constant $\tau$ for the contact angle kinetics is typically in the range from 5 s to 15 s with a final contact angle, $\theta_f$, in the range from 10° to 20°. The penetration depth of the reaction is an unknown factor in the area of coatings, since the films used are much thicker. One estimates the reaction depth in a Ti film to be 2 $\mu$m. This is more than two orders of magnitude thicker than the Ti thickness of the wetting layer according to the present invention. The observed spreading rates are in the range from 0.1 to 5 cm/s. The variations in time constant $\tau$ and in the spreading rate are attributed to differences in the availability of pure Ti, i.e. dependant on the purity and the thickness of the Ti layer.

In an aspect of the invention a filling process is disclosed based on reaction induced wetting, e.g. an Al$_3$Ti reaction, and simultaneously formation of a metal seed layer, e.g. a Al-containing metal, in the openings in an insulating layer formed on a substrate, e.g. a semiconductor wafer. Examples of such openings are via openings, contact openings and trenches. According to this aspect of the invention, a method for filling an opening in an insulating layer is disclosed comprising the steps of:

a) forming at least one opening in an insulating film;
b) forming a continuous wetting layer at least on an inner side wall of said opening;
c) depositing a first metal layer at least on said wetting layer at an elevated first temperature to thereby form a metal seed layer; and
d) depositing a second metal layer at an elevated second temperature to fill said opening from the bottom to the top.

In another embodiment of the invention, a method for filling an opening in an insulating layer is disclosed, wherein, after forming at least one opening in an insulating film, a barrier layer can be formed at least on an inner wall of said opening. Particularly said barrier layer, e.g. a TiN layer, is formed at least on the side walls of said openings.

Thereafter a continuous wetting layer, i.e. a thin Ti layer with a thickness typically of about 30 nm or below, is deposited on this barrier layer. The coverage of the inner walls of the opening is continuous, but the thickness on each point can vary. If the deposition of the Ti layer is performed by physical vapour deposition (PVD), then the amount of Ti per unit area is constant and independent of the aspect ratio or size of the opening to be filled.

An Al-containing metal, i.e. an alloy of or pure Al as e.g. AlCu, is deposited by means of PVD at an elevated first temperature on top of the Ti wetting layer in order to form an Al-containing metal seed layer. This elevated first temperature of the substrate is very close to the melting temperature of Al in high vacuum, i.e. typically in the range from 450 to 500° C. or in the range from 400 to 500° C. To form this seed layer appropriate use is made of the reaction induced wetting for seed layer formation. From the aforementioned principles of reaction, i.e. the Al$_3$Ti reaction induced wetting, it is obvious that the spreading kinetics are irrelevant for the filling process of sub-micron openings because the spreading rate of the Al-containing metal is about 0.1 cm/s or larger and therefore will not hamper the wetting process. Only the contact angle kinetics, having a time frame in the range from about 5 s to 15 s, at the beginning of the wetting has to be taken into account. Therefore, the total time frame of the process for reaction induced wetting is in the range of seconds. For each Ti atom, 3 atoms of Al are required to complete the Al$_3$Ti reaction. This reaction is exothermic and leads to an energy exchange of −37 kJ/g-atom. This means that for each Ti g-atom consumed in the reaction, 37 kJ will be released. Since the Al-containing deposition proceeds at a temperature close to the melting point of Al (in high vacuum), the melting energy has to be taken into account. The melting energy of Al is roughly 11 kJ/g-atom. Therefore, preferably, the deposition rate of the Al-containing metal on the Ti layer has to be chosen such that the amount of Al supplied on the Ti wetting layer in the time frame of the reaction induced wetting and the formation of an Al-containing metal seed layer is typically in the range from 5 to 6 Al atoms per Ti atom. The reaction induced wetting and the related melting of Al, because of the TiAl$_3$ formation, will lead to an almost instantaneous deposition of an ultra-thin Al-containing layer on top of the TiAl$_3$.layer. This time frame is typically in the range from 5 s to 15 s. If the deposition rate of the Al-containing metal is too low, not enough Al is present to form the seed layer. If the deposition rate of the Al-containing metal is too high, then the reaction induced wetting process and seed layer formation is stopped and normal Al-containing metal deposition and flow will occur on a part of the seed layer which is already formed. This part starts at the top of a side wall of the opening and extends into opening dependant on the deposition rate without completely covering said side wall. Therefore, if the deposition rate is not optimised a build up of Al will take place at the top of the opening. In an optimised process with an optimised deposition rate, the Al-containing metal will be spread out very fast over the inner walls of the opening thereby forming an Al-containing metal seed layer on these walls.

After the formation of the Al-containing metal seed layer, the remainder of the Al-containing layer is sputtered at an elevated second temperature, typically in the range from 400–500° C. This sputtering is performed slowly in order to give the Al-containing metal enough time to flow into the opening to thereby completely fill the opening from bottom to top. In order be able to apply an elevated first temperature during step c), i.e. the seed layer, and an elevated second temperature during d), i.e. the actual filling, a thermal contact has to be provided between the substrate and the substrate holder during step c) as well as step d) for heating purposes. If step c) and step d) are performed subsequently in a single chamber of a deposition tool, then the thermal contact between the substrate holder and the substrate can be maintained.

In a best mode of the invention a continuous wetting layer comprising Ti is formed by means of physical vapour deposition (PVD). As a consequence, contrary to e.g. using a chemical vapour deposition method, the total amount of Ti deposited per unit area is constant when using PVD. The reaction induced wetting and simultaneously the seed layer formation process has a very important characteristic that the formation of the seed layer is only determined by the total amount of Ti atoms per unit area. As a result, the Al-containing metal seed layer can be formed independent of the aspect ratio and the size of the openings, e.g. via openings, contact openings and trenches, and also independent of the density of the openings.

Figure 2:
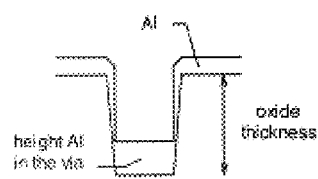
FIG. 2 depicts the via fill, i.e. the height of the Al in the via over the height of the via, for different sputter deposition powers (PVD) of Al versus the diameter of the via, i.e. ranging from 0.25 to 0.5 μm (height of the via 1 μm). According to an embodiment of the invention, the via fill for a 12 kW deposition power (1) is substantially independent of the via diameter while there is a clear dependence for a deposition power of 1 kW (2).
Figure 2:
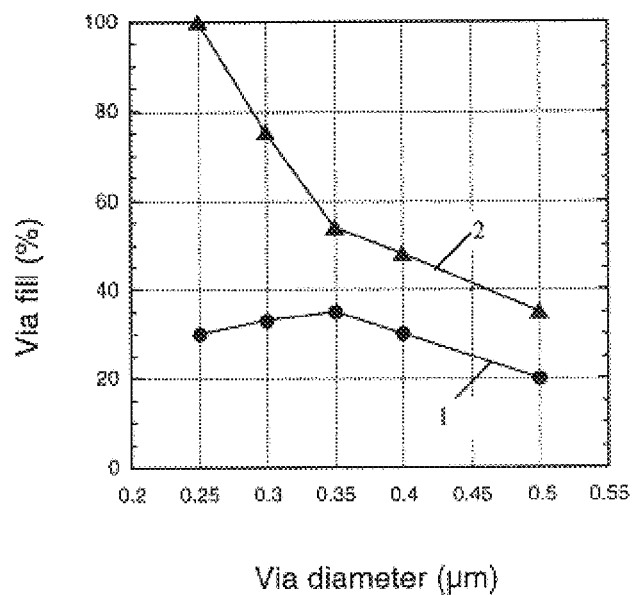

According to this best mode of the invention, as an example (see FIG. 2), two different power conditions (i.e. deposition rates) are applied to deposit an Al-containing metal layer on a wetting layer at a temperature of 475° C. with the purpose of forming an Al-containing metal seed layer completely covering said wetting layer. The wetting layer used is a continuous Ti layer with a thickness of about 20 nm. This wetting layer was deposited by means of PVD on an oxide layer with a thickness of 1 $\mu$m and having openings with a diameter ranging from 0.25 to 0.5 $\mu$m. Some other experimental data (for both conditions) are:

the density of Al in the Al-containing metal equals 2.7 g/cm$^3$, M=27 g/mol, N$_{Al}$=0.1 mol/cm$^3$;

the density of Ti equals 4.5 g/cm$^3$, M=48 g/mol, leading to an amount of 1.2 10$^{17}$ atoms/cm$^2$ for a 20 nm wetting layer;

the depositions are performed in a high vacuum multi-chamber deposition system of Applied Materials, i.e. an Endura.

The first power condition was chosen according to the method of the present invention: a deposition at a power of 12 kW and a thickness of 150nm, leading to a deposition rate of 25 nm/s or 1.5 10$^{17}$ atoms per second and per cm$^2$. As experimentally confirmed, see FIG. 1a), this deposition rate is in accordance with the method of the present invention. In other words, the amount of Al supplied on the Ti wetting layer in the time frame of the reaction induced wetting and the formation of an Al-containing metal seed layer is in accordance with the method of the present invention. The filling of the openings during this seed layer formation process (see FIG. 2) is substantially independent of the dimensions of the opening (1).

The second power condition was chosen as follows: a deposition at a power of 1 kW and a thickness of 70nm, leading to a deposition rate of 2.8 nm/s or 1.7 10$^{16}$ atoms per second per cm$^2$. As experimentally confirmed, see FIG. 2, this deposition rate is far too low, resulting in an opening dependent formation (2) of the Al-containing metal seed layer, i.e. dependent on the precise shape and dimensions of the opening. In other words, the amount of Al supplied on the Ti wetting layer in the time frame of the reaction induced wetting and the formation of an Al-containing metal seed layer is insufficient. In this case the reaction induced wetting and the complete seed layer coverage did not take place.

Figure 3:
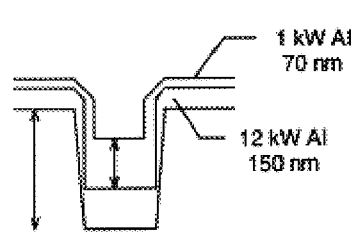
FIG. 3 depicts, according to an embodiment of the invention, the contact hole/via fill process on a previously formed seed layer. Particularly, a 1 kW deposition power is used during 25 s to deposit an Al-containing metal layer in order to fill these openings of different size and shape (11). The filling process is geometry dependent, but this dependence can easily be predicted with a simple geometrical model (12). The fill depends on the ratio of supply (circumference of the opening) and demand (volume of the opening).
Figure 3:
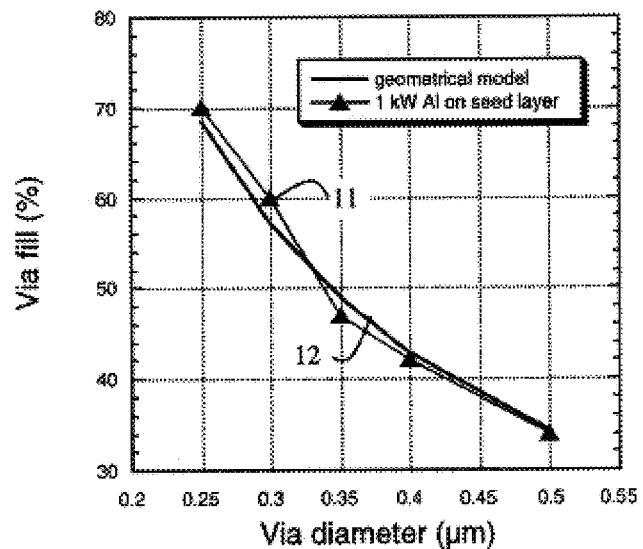

Yet further according to this best mode of the invention, after this deposition of a first Al-containing metal layer at a power of 12 kW thereby forming an Al-containing metal seed layer, a second Al-containing layer is deposited subsequently on this seed layer in order to further fill the openings, i.e. the via openings, contact openings and/or trenches. The deposition conditions of this second Al-containing layer are chosen such that the filling process is a surface diffusion based metal flow filling process. Therefore, a shape and geometry dependence of the filling of the opening is observed in accordance with known models, as in FIG. 3 (12). Because the diffusion is a surface diffusion, all openings are filled from bottom to top. Particularly, typically deposition powers range from about 0.5 kW to about 5 kW, but the invention is not limited hereto. Even more particularly, as in FIG. 1b) and FIG. 3 (11) a deposition power of 1 kW and a deposition time of only 25 s is used.

Figure 4:
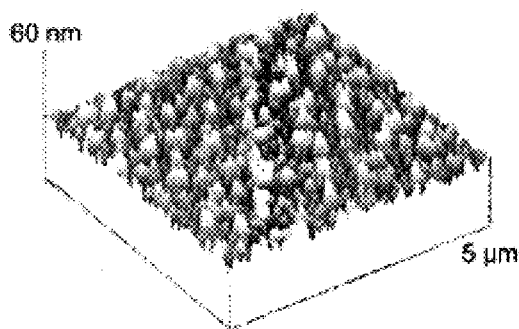
FIG. 4a) is, according to an embodiment of the invention, an AFM picture of the surface of the Al seed layer after ignition of the plasma.
FIG. 4b) is, according to an embodiment of the invention, an Auger Electron Spectroscopy (AES) depth profile of the Al seed layer and the Ti/TiN/TiN$_x$ wetting layer after the ignition of the Al plasma.
Figure 4:
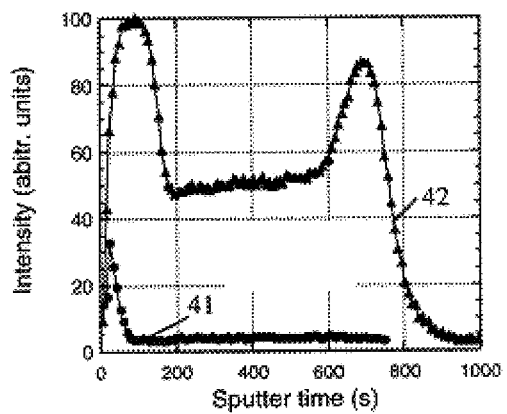

FIGS. 4a), 4b), 5a), 5b), and 6 further support the concept of reaction induced wetting when the power conditions are chosen according to the method of the present invention. Particularly, a power of 12 kW and a deposition rate of 25 nm/s was chosen. FIG. 4a) shows the surface of the wetting layer after the ignition of the plasma measured by Atomic Force Microscopy. Sub micron Al islands are observed to be spread over the surface. The accompanying Auger Electron Spectroscopy depth profile (FIG. 4b)) reveals the composition of the near surface region. The Ti signal (41) consists of two peaks separated by a plateau. The left Ti peak represents the wetting layer, the plateau the TiN layer and the right peak the Ti bottom layer. The Ti wetting layer exhibits a sharp interface at the surface. Another constituent of the surface is Al (42). FIG. 5a) displays a second snapshot of the surface after a deposition time of 2 seconds which corresponds to about 50 nm Al. A rapid growth of the Al grains in both the lateral and vertical dimension is observed which gives rise to coalescence of the formerly isolated Al islands. This is also reflected in the AES depth profile (FIG. 5b)). At the surface only a small concentration of Ti (51) is observed. The previously sharp interface has now considerably broadened. The Al signal (52) appears to consist of 2 parts: a near continuous surface layer, followed by a shoulder which coexists with the broadening of the Ti signal. The AES analysis does not yield information on the chemical make-up of the constituents. It is observed that TiAl$_3$ is the predominant intermetallic phase until the exhaustion of the Al supply. Thus both the broadening of the Ti signal and the Al shoulder are interpreted as an intermixing of Ti and Al and the onset of the intermetallic phase reaction. Further analysis has shown that if more Al is deposited the Al forms a continuous surface layer and the subsurface shoulder becomes more pronounced.

From the AFM measurements the contact angle of the Al grains on the substrate was extracted. Because the samples constitute a multi phase system, which undergoes rapid changes, the values of the contact angle represent the non equilibrium state of the wetting behavior. Immediately from the beginning of the sputter deposition low values of the contact angle were observed which drop further as the sputtering continues (FIG. 6). The contact angle and the AES measurements illustrate the point of reaction induced wetting at which the $TiAl_3$ phase formation helps to spread the Al on the surface. On the other hand the premise that the intermetallic phase formation must be kept at bay could also be realized. After 2–4 seconds the flow of Al outruns the $TiAl_3$ reaction.

What is claimed is:

1. A method for filling an opening in an insulating layer comprising the following steps in sequence:
    a) lining said opening with a reactive wetting layer at the surface by physical vapor deposition;
    b) depositing a metal layer on said wetting layer at an elevated first temperature to thereby react the metal with said wetting layer and form a continuous metal seed layer over said wetting layer; and
    c) continuing to deposit a layer of said metal at an elevated second temperature but at a reduced deposition rate so as to fill said opening from the bottom to the top.

2. A method as recited in claim 1, wherein the deposition rate of said first metal is such that there is sufficient metal available to induce a reaction between said wetting layer and said metal and simultaneously to form said metal seed layer.

3. A method as recited in claim 1, further comprising the step of:
    forming a barrier layer at least on an inner wall of said opening after forming at least one opening in an insulating film.

4. A method as recited in claim 3, wherein said barrier layer is selected from the group consisting of a TiN layer, a bilayer of Ti and TiN and a trilayer of Ti/TiN/TiN, wherein x is less than 1.

5. A method as recited in claim 1, wherein said elevated first temperature and said elevated second temperature are chosen in the range from 100° C. below the melting point of said metal layer in vacuum to about the melting point of said metal layer in vacuum.

6. A method as recited in claim 1, wherein said wetting layer is a Ti-containing or a Co-containing layer and wherein said metal layer is an Al-containing layer or a Cu-containing layer.

7. A method as recited in claim 6, wherein said Al-containing layer further comprises at least one element selected from the group of Cu, Si and Ge.

8. A method as in claim 1, wherein said first metal layer is an Al-containing metal layer being deposited with a deposition rate in the range from 10 nm/s to 50 nm/s.

9. A method as in claim 1, wherein said wetting layer is deposited using a physical vapour deposition technique.

10. An integrated circuit comprising an interconnect structure, wherein the process of forming said interconnect structure comprises the method for filling an opening in an insulating layer as recited in claim 1.

11. A method according to claim 1 wherein the metal layer is deposited initially at a first power and a first deposition rate.

12. A method according to claim 11 wherein said metal layer is thereafter deposited at a second power and a second, lower, deposition rate.

13. A method of filling an opening in an insulating layer comprising
    a) lining said opening with a titanium-containing layer having a wetting titanium-rich surface;
    b) sputter depositing an aluminum-containing metal into said opening at a rate so that the aluminum reacts with said titanium-rich surface to form a continuous titanium trialuminide metal seed layer; and
    c) sputter depositing an aluminum-containing metal at a deposition rate so that the aluminum fills the opening from the bottom to the top.

14. A method according to claim 13 wherein step b) is carried out at a first power, and step c) is carried out at a second, lower power.

15. A method according to claim 14 wherein said first power is about 12 killowatts.

16. A method according to claim 14 wherein said second power is from about 0.5 to 5 killowatts.

* * * * *